US012777677B2

(12) United States Patent
Liu et al.

(10) Patent No.: US 12,777,677 B2
(45) Date of Patent: Oct. 27, 2026

(54) DRIVING SUBSTRATE, MANUFACTURING METHOD THEREOF, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Fangmei Liu, Shenzhen (CN); Weiran Cao, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 1266 days.

(21) Appl. No.: 17/753,685

(22) PCT Filed: Mar. 4, 2022

(86) PCT No.: PCT/CN2022/079165
§ 371 (c)(1),
(2) Date: Aug. 24, 2023

(87) PCT Pub. No.: WO2023/155249
PCT Pub. Date: Aug. 24, 2023

(65) Prior Publication Data

US 2024/0088300 A1 Mar. 14, 2024

(30) Foreign Application Priority Data

Feb. 17, 2022 (CN) ........................ 202210144176.9

(51) Int. Cl.
*H10D 30/67* (2025.01)
*H10D 86/01* (2026.01)
(Continued)

(52) U.S. Cl.
CPC ....... *H10D 30/6723* (2025.01); *H10D 86/021* (2025.01); *H10D 86/40* (2025.01);
(Continued)

(58) Field of Classification Search
CPC .. H10D 86/021; H10D 86/40; H10D 30/6723; H10D 86/60; H10K 59/126
See application file for complete search history.

(56) References Cited

U.S. PATENT DOCUMENTS

2020/0279525 A1 9/2020 Kawashima et al.
2023/0086999 A1 * 3/2023 Su ............................ G09G 3/20
345/204

FOREIGN PATENT DOCUMENTS

CN 104977764 A 10/2015
CN 106684103 A 5/2017
(Continued)

OTHER PUBLICATIONS

International Search Report in International application No. PCT/CN2022/079165, mailed on Nov. 17, 2022.
(Continued)

*Primary Examiner* — Jose R Diaz
(74) *Attorney, Agent, or Firm* — PV IP PC; Christopher S. Ruprecht; Wei Te Chung

(57) ABSTRACT

A driving substrate, a manufacturing method thereof, and a display panel are disclosed. The driving substrate includes a display area and a non-display area. The driving substrate includes a substrate, a first thin film transistor structure, and a second thin film transistor structure. The first thin film transistor structure is disposed on the substrate and corresponds to the non-display area. The first thin film transistor structure includes a first light shielding layer, a first active layer, and a first gate electrode. The first light shielding layer
(Continued)

is multiplexed into the second gate. The first light shielding layer is electrically connected to the first gate electrode.

2 Claims, 5 Drawing Sheets

(51) Int. Cl.

| | |
|---|---|
| ***H10D 86/40*** | (2025.01) |
| ***H10D 86/60*** | (2025.01) |
| ***H10H 20/831*** | (2025.01) |
| ***H10K 59/126*** | (2023.01) |
| ***H10W 90/00*** | (2026.01) |

(52) U.S. Cl.

CPC ......... *H10D 86/421* (2025.01); *H10D 86/423* (2025.01); *H10D 86/441* (2025.01); *H10D 86/60* (2025.01); *H10H 20/831* (2025.01); *H10W 90/00* (2026.01); *H10K 59/126* (2023.02)

(56) References Cited

FOREIGN PATENT DOCUMENTS

| | | | |
|---|---|---|---|
| CN | 110750021 | A | 2/2020 |
| CN | 111192884 | A | 5/2020 |
| CN | 112289841 | A | 1/2021 |
| CN | 112420745 | A | 2/2021 |
| CN | 112466948 | A | 3/2021 |
| KR | 20160001851 | A | 1/2016 |
| KR | 20190061823 | A | 6/2019 |

OTHER PUBLICATIONS

Written Opinion of the International Search Authority in International application No. PCT/CN2022/079165, mailed on Nov. 17, 2022.

Chinese Office Action issued in corresponding Chinese Patent Application No. 202210144176.9 dated Feb. 22, 2025, pp. 1-8.

Chinese Office Action issued in corresponding Chinese Patent Application No. 202210144176.9 dated Aug. 10, 2024, pp. 1-9.

* cited by examiner

DRIVING SUBSTRATE, MANUFACTURING METHOD THEREOF, AND DISPLAY PANEL

FIELD OF INVENTION

The present application relates to the field of display technologies, and more particularly to a driving substrate, a manufacturing method thereof, and a display panel.

BACKGROUND OF INVENTION

With the development of display technology, there are more and more demands for large-sized and high-quality display devices. Oxide semiconductors are often used in large-scale and high-quality organic light-emitting diode (OLED) display applications due to their good characteristics and fabrication process advantages. Gate driver on array (GOA for short) is a driving method that integrates a gate driving circuit on an array substrate of a display panel to realize progressive scanning. Therefore, the gate driving circuit part can be omitted, which has advantages of reducing the production cost and realizing a design of a narrow frame of the panel and is used for various displays. As a mainstream display technology, GOA technology has obvious advantages in achieving low cost and reducing borders in high-quality display devices. As we all know, the GOA region needs to be driven with high current. Therefore, if a conventional device structure is used, it is necessary to increase a size of a thin film transistor (TFT) to increase the current. The size of the TFT limits the size of the GOA circuit and the size of the frame to a certain extent. Therefore, improving a carrier mobility of the TFT in the GOA region can reduce the size of the driving substrate, thereby realizing a narrow frame design.

Therefore, it is necessary to propose a new technical solution to solve the above-mentioned technical problems.

Technical Problem

Embodiments of the present application provide a driving substrate, a manufacturing method thereof, and a display panel, which are used to reduce a size of the driving substrate, thereby realizing a narrow frame design.

SUMMARY OF INVENTION

Embodiments of the present application provide a driving substrate comprising a display area and a non-display area, wherein the non-display area is located on at least one side of the display area, and the driving substrate comprises:

a substrate;

a first thin film transistor structure disposed on the substrate and corresponding to the non-display area, wherein the first thin film transistor structure comprises a first light shielding layer, a first active layer, a first gate electrode, and a first source electrode, and a first drain electrode, the first light shielding layer is multiplexed into a second gate electrode, and the first light shielding layer is electrically connected to the first gate electrode;

a second thin film transistor structure located on the substrate and corresponding to the display area, wherein the second thin film transistor structure comprises a second light shielding layer, a second active layer, a third gate electrode, a second source electrode, and a second drain electrode, and the second light shielding layer is electrically connected to the second source electrode.

In the driving substrate provided in the embodiments of the present application, the first light shielding layer is located on the substrate, and the driving substrate further comprises:

a buffer layer located on a side of the first light shielding layer away from the substrate;

a gate insulating layer located on a side of the first active layer away from the buffer layer and covering the first active layer, wherein the gate insulating layer comprises a first via hole, and the first via hole penetrates the gate insulating layer and the buffer layer;

a connection electrode disposed in the first via hole;

an interlayer dielectric layer located on a side of the first gate electrode away from the gate insulating layer, wherein the interlayer dielectric layer comprises a second via hole and a third via hole;

wherein the second via hole and the third via hole penetrates the interlayer dielectric layer, and the first source electrode and the first drain electrode are electrically connected to the first active layer through the second via hole and the third via hole, respectively;

a passivation layer located on a side of the interlayer dielectric layer away from the first gate electrode.

In the driving substrate provided in the embodiments of the present application, the driving substrate further comprises:

a buffer layer located on a side of the first light shielding layer away from the substrate;

a gate insulating layer located on a side of the first active layer away from the buffer layer;

an interlayer dielectric layer located on a side of the first gate electrode away from the gate insulating layer, wherein the interlayer dielectric layer comprises a first via hole, a second via hole, a third via hole, and a fourth via hole;

wherein the first via hole, the second via hole, and the third via hole penetrate the interlayer dielectric layer, and the fourth via hole penetrates the interlayer dielectric layer and the buffer layer, and the first source electrode and the first drain electrode are electrically connected to the first active layer through the second via hole and the third via hole, respectively;

a connection electrode, wherein the connection electrode comprises a first connection electrode, a second connection electrode, and a connection part, the first connection electrode and the second connection electrode are connected by the connection part, the connection part is located on the interlayer dielectric layer, the first connection electrode is disposed in the first via hole, and the second connection electrode is disposed in the fourth via hole;

a passivation layer located on a side of the interlayer dielectric layer away from the first gate electrode and covering the first source electrode, the first drain electrode, and the connection electrode.

In the driving substrate provided in the embodiments of the present application, the connection electrode and the first source electrode are disposed in a same layer.

In the driving substrate provided in the embodiments of the present application, the driving substrate further comprises:

a third thin film transistor structure located on the substrate and corresponding to the display area, wherein the third thin film transistor structure comprises a third active layer, a fourth gate electrode, a third source electrode, and a third drain electrode.

In the driving substrate provided in the embodiments of the present application, the first light shielding layer and the second light shielding layer are disposed in a same layer;

the first active layer, the second active layer, and the third active layer are disposed in a same layer;

the first gate electrode, the third gate electrode, and the fourth gate electrode are disposed in a same layer;

the first source electrode, the first drain electrode, the second source electrode, the second drain electrode, the third source electrode, and the third drain electrode are disposed in a same layer.

In the driving substrate provided in the embodiments of the present application, the driving substrate further comprises:

a fourth thin film transistor structure located on the substrate and corresponding to the display area, wherein the fourth thin film transistor structure comprises a fourth active layer, a fifth gate electrode, a fourth source electrode, and a fourth drain electrode; wherein:

the fourth active layer and the third active layer are disposed in a same layer;

the fifth gate electrode and the fourth gate electrode are disposed in a same layer;

the fourth source electrode, the fourth drain electrode, the third source electrode, and the third drain electrode are disposed in a same layer.

In the driving substrate provided in the embodiments of the present application, an orthographic projection of the first light shielding layer on the substrate covers an orthographic projection of the first active layer on the substrate.

In the driving substrate provided in the embodiments of the present application, the first active layer is an amorphous silicon active layer or a metal oxide active layer, and the second active layer and the third active layer are metal oxide active layers.

Correspondingly, embodiments of the present application further provide a display panel, the display panel comprises a driving substrate and a light-emitting functional layer, the light-emitting functional layer is disposed on the driving substrate and is located in a display area, and the driving substrate comprises:

a substrate;

a first thin film transistor structure disposed on the substrate and corresponding to a non-display area, wherein the first thin film transistor structure comprises a first light shielding layer, a first active layer, a first gate electrode, and a first source electrode, and a first drain electrode, the first light shielding layer is multiplexed into a second gate electrode, and the first light shielding layer is electrically connected to the first gate electrode;

a second thin film transistor structure located on the substrate and corresponding to the display area, wherein the second thin film transistor structure comprises a second light shielding layer, a second active layer, a third gate electrode, a second source electrode, and a second drain electrode, and the second light shielding layer is electrically connected to the second source electrode.

In the display panel provided in the embodiments of the present application, the driving substrate further comprises:

a buffer layer located on a side of the first light shielding layer away from the substrate;

a gate insulating layer located on a side of the first active layer away from the buffer layer and covering the first active layer, wherein the gate insulating layer comprises a first via hole, and the first via hole penetrates the gate insulating layer and the buffer layer;

a connection electrode disposed in the first via hole;

an interlayer dielectric layer located on a side of the first gate electrode away from the gate insulating layer, wherein the interlayer dielectric layer comprises a second via hole and a third via hole;

wherein the second via hole and the third via hole penetrates the interlayer dielectric layer, and the first source electrode and the first drain electrode are electrically connected to the first active layer through the second via hole and the third via hole, respectively;

a passivation layer located on a side of the interlayer dielectric layer away from the first gate electrode.

In the display panel provided in the embodiments of the present application, the driving substrate further comprises:

a buffer layer located on a side of the first light shielding layer away from the substrate;

a gate insulating layer located on a side of the first active layer away from the buffer layer;

an interlayer dielectric layer located on a side of the first gate electrode away from the gate insulating layer, wherein the interlayer dielectric layer comprises a first via hole, a second via hole, a third via hole, and a fourth via hole;

wherein the first via hole, the second via hole, and the third via hole penetrate the interlayer dielectric layer, and the fourth via hole penetrates the interlayer dielectric layer and the buffer layer, and the first source electrode and the first drain electrode are electrically connected to the first active layer through the second via hole and the third via hole, respectively;

a connection electrode, wherein the connection electrode comprises a first connection electrode, a second connection electrode, and a connection part, the first connection electrode and the second connection electrode are connected by the connection part, the connection part is located on the interlayer dielectric layer, the first connection electrode is disposed in the first via hole, and the second connection electrode is disposed in the fourth via hole;

a passivation layer located on a side of the interlayer dielectric layer away from the first gate electrode and covering the first source electrode, the first drain electrode, and the connection electrode.

In the display panel provided in the embodiments of the present application, the connection electrode and the first source electrode are disposed in a same layer.

In the display panel provided in the embodiments of the present application, the driving substrate further comprises:

a third thin film transistor structure located on the substrate and corresponding to the display area, wherein the third thin film transistor structure comprises a third active layer, a fourth gate electrode, a third source electrode, and a third drain electrode.

In the display panel provided in the embodiments of the present application, the first light shielding layer and the second light shielding layer are disposed in a same layer;

the first active layer, the second active layer, and the third active layer are disposed in a same layer;

the first gate electrode, the third gate electrode, and the fourth gate electrode are disposed in a same layer;

the first source electrode, the first drain electrode, the second source electrode, the second drain electrode, the third source electrode, and the third drain electrode are disposed in a same layer.

In the display panel provided in the embodiments of the present application, the driving substrate further comprises:

a fourth thin film transistor structure located on the substrate and corresponding to the display area, wherein the fourth thin film transistor structure comprises a fourth active layer, a fifth gate electrode, a fourth source electrode, and a fourth drain electrode; wherein:

the fourth active layer and the third active layer are disposed in a same layer;

the fifth gate electrode and the fourth gate electrode are disposed in a same layer;

the fourth source electrode, the fourth drain electrode, the third source electrode, and the third drain electrode are disposed in a same layer.

In the display panel provided in the embodiments of the present application, an orthographic projection of the first light shielding layer on the substrate covers an orthographic projection of the first active layer on the substrate.

Correspondingly, embodiments of the present application further provide a manufacturing method of a driving substrate, the manufacturing method of the driving substrate comprises the following steps:

providing a substrate;

forming a first thin film transistor structure and a second thin film transistor structure on the substrate, wherein the first thin film transistor structure comprises a first light shielding layer, a first active layer, a first gate electrode, a first source electrode, and a first a drain electrode, the first light shielding layer is multiplexed into a second gate electrode, the first light shielding layer and the first gate electrode are electrically connected, the second thin film transistor structure comprises a second light shielding layer, a second active layer, a third gate electrode, a second source electrode, and a second drain electrode, and the second light shielding layer and the second source electrode are electrically connected.

In the manufacturing method of the driving substrate provided in the embodiments of the present application, the step of forming the first thin film transistor structure and the second thin film transistor structure on the substrate further comprises:

forming a light shielding material layer on the substrate, and patterning the light shielding material layer to form the first light shielding layer and the second light shielding layer;

forming a buffer layer on the first light shielding layer and the second light shielding layer;

forming a semiconductor material layer on the buffer layer, and patterning the semiconductor material layer to form the first active layer and the second active layer;

forming a gate insulating layer on the buffer layer, and processing the gate insulating layer by a yellow light process to form a first via hole;

forming a first metal layer on the gate insulating layer, and patterning the first metal layer to form the first gate electrode, the third gate electrode, and a connection electrode, wherein the connection electrode is disposed in the first via hole, and the first gate electrode and the first light shielding layer are electrically connected through the connection electrode;

forming an interlayer dielectric layer on the first gate electrode, and processing the interlayer dielectric layer by a yellow light process to form a second via hole, a third via hole, a first contact hole, a second contact hole, and a third contact hole;

forming a second metal layer on the interlayer dielectric layer, and patterning the second metal layer to form the first source electrode, the first drain electrode, the second source electrode, the second drain electrode, and an auxiliary electrode, wherein the first source electrode and the first drain electrode are electrically connected to the first active layer through the second via hole and the third via hole, respectively, the auxiliary electrode is disposed in the first contact hole, and the second source electrode and the second drain electrode are electrically connected to the second active layer through the second contact hole and the third contact hole, respectively;

forming a passivation layer on the interlayer dielectric layer.

In the manufacturing method of the driving substrate provided in the embodiments of the present application, the step of forming the first thin film transistor structure and the second thin film transistor structure on the substrate further comprises:

forming a light shielding material layer on the substrate, and patterning the light shielding material layer to form the first light shielding layer and the second light shielding layer;

forming a buffer layer on the first light shielding layer and the second light shielding layer;

forming a semiconductor material layer on the buffer layer, and patterning the semiconductor material layer to form the first active layer and the second active layer;

forming an insulating material layer on the first active layer and the second active layer;

forming a first metal layer on the insulating material layer, and patterning the first metal layer to form the first gate and the third gate;

using the first gate and the third gate to be self-aligned, and patterning the insulating material layer to form a gate insulating layer;

forming an interlayer dielectric layer on the first gate electrode, and processing the interlayer dielectric layer by a yellow light process to form a first via hole, a second via hole, a third via hole, a fourth via hole, a first contact hole, a second contact hole, and a third contact hole;

forming a second metal layer on the interlayer dielectric layer, and patterning the second metal layer to form the first source electrode, the first drain electrode, the connection electrode, the second source electrode, the second drain electrode, and an auxiliary electrode, wherein the connection electrode comprises a first connection electrode, a second connection electrode, and a connection part, and the first connection electrode and the second connection electrode are connected by the connection part, the first connection electrode is disposed in the first via hole, the second connection electrode is disposed in the fourth via hole, the first source electrode and the first drain electrode are electrically connected through the second via hole and the third via hole, respectively; the auxiliary electrode is disposed in the first contact hole, and the second source electrode and the second drain electrode are electrically connected to the second active layer through the second contact hole and the third contact hole, respectively;

forming a passivation layer on the interlayer dielectric layer.

Beneficial Effect:

Embodiments of the present application provide a driving substrate, a manufacturing method thereof, and a display panel. The driving substrate comprises a display area and a non-display area, and the non-display area is located on at least one side of the display area. The driving substrate comprises a substrate, a first thin film transistor structure, and a second thin film transistor structure. The first thin film transistor structure is disposed on the substrate and corresponds to the non-display area. The first thin film transistor structure comprises a first light shielding layer, a first active layer, a first gate electrode, and a first source electrode, and a first drain electrode. The first light shielding layer is multiplexed into a second gate electrode. The first light shielding layer is electrically connected to the first gate electrode. The second thin film transistor structure is located on the substrate and corresponds to the display area. The second thin film transistor structure comprises a second light shielding layer, a second active layer, a third gate electrode, a second source electrode, and a second drain electrode, and the second light shielding layer is electrically connected to the second source electrode. In this embodiment of the present application, the first light shielding layer can not only be used to shield the first active layer from light, but also prevent light from affecting stability of the first active layer. In addition, since the first light shielding layer is multiplexed into the second gate, and the first light shielding layer and the first gate electrode are electrically connected, two conductive channels are formed, which increases an on-state current. In addition, a negative drift of a threshold voltage is effectively suppressed, and mobility of carriers is improved, thereby facilitating a design of a narrow frame. In addition, the second light shielding layer can not only be used to shield the second active layer from light to prevent the light from affecting stability of the second active layer, and the second light shielding layer is electrically connected to the second source electrode because the second light shielding layer is electrically connected to the second active layer. Both the second active layer and the third gate electrode have overlapping regions, and parasitic capacitances are formed between the second light shielding layer, the second active layer, and the third gate electrode, respectively. When the driving substrate is working, a voltage on the second drain electrode will change as a voltage applied to a data signal line is different. This causes a voltage on the second light shielding layer to change accordingly, thereby affecting electrical properties of the second active layer. By connecting the second light shielding electrode and the second source electrode to form an equipotential, it can be avoided that a voltage change on the second light shielding layer affects electrical properties of the second active layer.

DESCRIPTION OF DRAWINGS

In order to illustrate the technical solutions in the embodiments of the present application more clearly, the following briefly introduces the accompanying drawings that are used in the description of the embodiments. The drawings in the following description are only some embodiments of the present application. For those skilled in the art, other drawings can also be obtained from these drawings without creative effort.

DETAILED DESCRIPTION OF PREFERRED EMBODIMENTS

Figure 1:
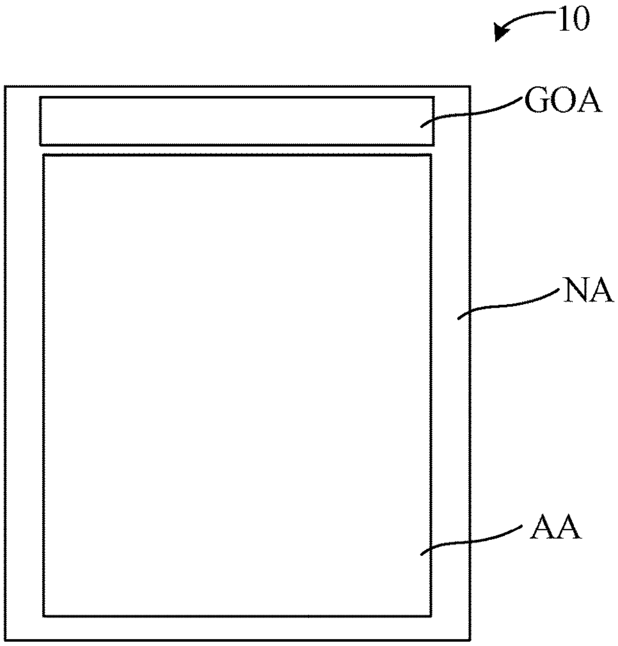
FIG. 1 is a schematic plan view of a driving substrate provided by an embodiment of the present application.

In order to make the objectives, technical solutions and advantages of the present application clearer, the present application will be further described in detail below with reference to the accompanying drawings. Please refer to the drawings in the accompanying drawings, wherein the same reference numerals represent the same components. The following description is based on the specific embodiments of the present application shown and should not be construed as limiting other specific embodiments of the present application not detailed herein. As used in this specification, the word “embodiment” means an example, instance, or illustration.

In the description of the present application, it should be understood that the orientation or positional relationship indicated by the terms “center”, “longitudinal”, “lateral”, “length”, “width”, “thickness”, “upper”, “lower”, “front”, “back”, “left”, “right”, “vertical”, “horizontal”, “top”, “bottom”, “inside”, “outside” and the like is based on the orientation or positional relationship shown in the accompanying drawings. This is only for ease of describing the application and to simplify the description. It is not indicated or implied that the referred device or element must have a particular orientation, be constructed and operate in a particular orientation. Therefore, it should not be construed as a limitation on this application. In addition, the terms “first” and “second” are only used for descriptive purposes, and should not be construed as indicating or implying relative importance or implying the number of indicated technical features. Thus, features defined as “first”, “second” may expressly or implicitly include one or more of said features. In the description of this application, “plurality” means two or more, unless expressly and specifically defined otherwise.

Embodiments of the present application provide a driving substrate, a manufacturing method thereof, and a display panel. Each of them will be described in detail below. It should be noted that the description order of the following embodiments is not intended to limit the preferred order of the embodiments.

Embodiments of the present application provide a driving substrate. The driving substrate comprises a display area and a non-display area, and the non-display area is located on at least one side of the display area. The driving substrate comprises a substrate, a first thin film transistor structure, and a second thin film transistor structure. The first thin film transistor structure is disposed on the substrate and corresponds to the non-display area. The first thin film transistor structure comprises a first light shielding layer, a first active layer, a first gate electrode, and a first source electrode, and a first drain electrode. The first light shielding layer is multiplexed into a second gate electrode. The first light shielding layer is electrically connected to the first gate electrode. The second thin film transistor structure is located on the substrate and corresponds to the display area. The second thin film transistor structure comprises a second light shielding layer, a second active layer, a third gate electrode, a second source electrode, and a second drain electrode, and the second light shielding layer is electrically connected to the second source electrode. In this embodiment of the present application, the first light shielding layer can not only be used to shield the first active layer from light, but also prevent light from affecting stability of the first active layer. In addition, since the first light shielding layer is multiplexed into the second gate, and the first light shielding layer and the first gate electrode are electrically connected, two conductive channels are formed, which increases an on-state current. In addition, a negative drift of a threshold voltage is effectively suppressed, and mobility of carriers is improved, thereby facilitating a design of a narrow frame. In addition, the second light shielding layer can not only be used to shield the second active layer from light to prevent the light from affecting stability of the second active layer, and the second light shielding layer is electrically connected to the second source electrode because the second light shielding layer is electrically connected to the second active layer. Both the second active layer and the third gate electrode have overlapping regions, and parasitic capacitances are formed between the second light shielding layer, the second active layer, and the third gate electrode, respectively. When the driving substrate is working, a voltage on the second drain electrode will change as a voltage applied to a data signal line is different. This causes a voltage on the second light shielding layer to change accordingly, thereby affecting electrical properties of the second active layer. By connecting the second light shielding electrode and the second source electrode to form an equipotential, it can be avoided that a voltage change on the second light shielding layer affects electrical properties of the second active layer.

It should be noted that, in this embodiment of the present application, the non-display area may include a gate driving area.

The driving substrate provided by the present application will be described in detail below through specific embodiments.

Figure 2:
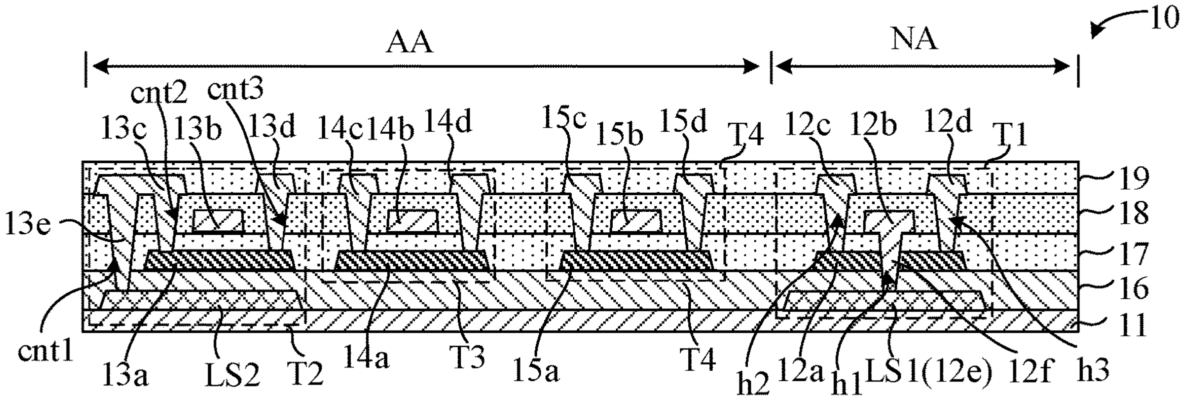
FIG. 2 is a schematic diagram of a first structure of a driving substrate provided by an embodiment of the present application.

Referring to FIG. 1 and FIG. 2. FIG. 1 is a schematic plan view of a driving substrate provided by an embodiment of the present application. FIG. 2 is a schematic diagram of a first structure of a driving substrate provided by an embodiment of the present application. The driving substrate 10 includes a display area AA and a non-display area NA, and the non-display area NA is located on at least one side of the display area AA. The non-display area NA includes a gate driving area GOA.

The driving substrate 10 includes a substrate 11, a first thin film transistor structure T1, and a second thin film transistor structure T2. The first thin film transistor structure T1 is disposed on the substrate 11 and corresponds to the non-display area NA. The first thin film transistor structure T1 includes a first light shielding layer LS1, a first active layer 12*a*, a first gate electrode 12*b*, a first source electrode 12*c*, and a first drain electrode 12*d*. The first light shielding layer LS1 is multiplexed into a second gate electrode 12*e*. The first light shielding layer LS1 is electrically connected to the first gate electrode 12*b*. The second thin film transistor structure T2 is located on the substrate 11 and corresponds to the display area AA. The second thin film transistor structure T2 includes a second light shielding layer LS2, a second active layer 13*a*, a third gate electrode 13*b*, a second source electrode 13*c*, and a second drain electrode 13*d*. The second light shielding layer LS2 is electrically connected to the second source electrode 13*c*. In this embodiment of the present application, the first light shielding layer LS1 can not only be used to shield the first active layer 12*a* from light, but also prevent light from affecting the stability of the first active layer 12*a*. In addition, since the first light shielding layer LS1 is multiplexed into the second gate electrode 12*e*, and the first light shielding layer LS1 and the first gate electrode 12*b* are electrically connected, two conductive channels are formed. This increases the on-state current, thereby effectively suppressing the negative drift of the threshold voltage, and improving the mobility of carriers, thereby facilitating the design of narrow frames. In addition, the second light shielding layer LS2 can not only be used to shield the second active layer 13*a* from light, but also prevent the light from affecting the stability of the second active layer 13*a*. In addition, the second light shielding layer LS2 and the second source electrode 13*c* are electrically connected. Since the second light shielding layer LS2 has overlapping regions with the second active layer 13*a* and the third gate electrode 13*b*, parasitic capacitances are formed between the second light shielding layer LS2, the second active layer 12*a*, and the third gate electrode 13*b*, respectively. When the driving substrate is operating, the voltage on the second drain electrode 13*d* will change as the voltage applied to the data signal line is different. This causes the voltage on the second light shielding layer LS2 to change accordingly, thereby affecting the electrical properties of the second active layer 13*a*. By connecting the second light shielding layer LS2 and the second source electrode 13*c* to form an equipotential, it can be avoided that the voltage change on the second light shielding layer LS2 affects the electrical properties of the second active layer 13*a*.

Further, the first light shielding layer LS1 and the second light shielding layer LS2 are located on the substrate 11. The driving substrate 10 further includes a buffer layer 16, a gate insulating layer 17, a connection electrode 12*f*, an interlayer dielectric layer 18, and a passivation layer 19. The buffer layer 16 is located on the side of the first light shielding layer LS1 away from the substrate 11. The gate insulating layer 17 is located on the side of the first active layer 12*a* away from the buffer layer 16 and covers the first active layer 12*a* and the second active layer 13*a*. The gate insulating layer 17 includes the first via hole h1. The first via hole h1 penetrates the gate insulating layer 17 and the buffer layer 16. The connection electrode 12*f* is provided in the first via hole h1. The interlayer dielectric layer 18 is located on the side of the first gate electrode 12*b* away from the gate insulating layer 17. The interlayer dielectric layer 18 includes a second via hole h2 and a third via hole h3. The second via hole h2 and the third via hole h3 penetrate the interlayer dielectric layer 18. The first source electrode 12*c* is electrically connected to the first active layer 12*a* through the second via hole h2. The first drain electrode 12*d* is electrically connected to the first active layer 12*a* through the third via hole h3. The passivation layer 19 is located on the side of the interlayer dielectric layer 18 away from the first gate electrode 12*b*.

In some embodiments, an orthographic projection of the first light shielding layer LS1 on the substrate 11 covers an orthographic projection of the first active layer 12*a* on the substrate 11. In the embodiment of the present application, since the orthographic projection of the first light shielding layer LS1 on the substrate 11 covers the orthographic projection of the first active layer 12*a* on the substrate 11, this enables the light to be completely shielded by the first light shielding layer LS1 when the light is irradiated on the first active layer 12*a*, thereby improving the stability of the driving substrate 10.

Optionally, in some embodiments, the driving substrate 10 may further include a third thin film transistor structure T3. The third thin film transistor structure T3 is disposed on the substrate 11 and corresponds to the display area AA. The third thin film transistor structure T3 includes a third active layer 14*a*, a fourth gate electrode 14*b*, a third source electrode 14*c*, and a third drain electrode 14*d*. In the embodiment of the present application, the first light shielding layer LS1 and the second light shielding layer LS2 are provided in the same layer. The first active layer 12*a*, the second active layer 13*a*, and the third active layer 14*a* are provided in the same layer. The first gate electrode 12*b*, the third gate electrode 13*b*, and the fourth gate electrode 14*b* are provided in the same layer. The first source electrode 12*c*, the first drain electrode 12*d*, the second source electrode 13*c*, the second drain electrode 13*d*, the third source electrode 14*c*, and the third drain electrode 14*d* are provided in the same layer.

It should be understood that the second thin film transistor structure T2 in the embodiment of the present application may be a driving thin film transistor, and the third thin film transistor structure T3 may be a switching thin film transistor.

In the embodiment of the present application, the structure of the driving circuit located in the display area AA is 2T1C (i.e., two thin film transistors and one capacitor). The 2T1C driving circuit architecture has a simple fabrication process, and because two thin film transistors are used to drive one sub-pixel unit, it is beneficial to realize miniaturization.

In some embodiments, the first active layer 12*a* is an amorphous silicon active layer, and the second active layer 13*a* and the third active layer 14*a* are metal oxide active layers. In the embodiment of the present application, the active layer of the thin film transistor in the display area AA of the driving substrate 10 and the active layer of the thin film transistor in the non-display area NA are made of different materials. The active layer of the thin film transistor in the display area AA of the driving substrate 10 is made of metal oxide semiconductor material. In this way, when the resolution of the display product is high, since the mobility of the metal oxide semiconductor material is relatively high, the charging rate requirement of the high-resolution display product can also be met. The active layer of the thin film transistor in the non-display area NA of the driving substrate 10 is made of a non-metal oxide semiconductor material. This can prevent the threshold voltage Vth from drifting under the long-term bias effect of the thin film transistor. This ensures that the characteristics of the thin film transistor will not change, and the normal scanning function of the circuit in the non-display area NA is ensured.

In some embodiments, the first active layer 12*a* may be a metal oxide active layer, and the second active layer 13*a* and the third active layer 14*a* may be metal oxide active layers. In the embodiment of the present application, both the display area AA and the non-display area NA of the driving substrate 10 are made of metal oxide semiconductor materials. Therefore, the preparation of the first active layer 12*a*, the second active layer 13*a*, and the third active layer 14*a* can be completed simultaneously through one mask process, which simplifies the process of the driving substrate 10.

In some embodiments, the first active layer 12*a* may include a first sub-active layer, a second sub-active layer, and a third sub-active layer that are stacked in sequence. The atomic number of gallium in the first sub-active layer and the third sub-active layer is greater than the atomic number of gallium in the second sub-active layer. Due to the strong binding ability of gallium to oxygen atoms, the generation of deep level defects can be effectively suppressed. Thus, the stability of the device is improved, thereby improving the reliability of the display panel. The ratio of the number of indium atoms, the number of gallium atoms and the number of zinc atoms in the second sub-active layer is indium:gallium:zinc equal to 1:1:1, which ensures the conductivity and mobility of the driving substrate 10.

In some embodiments, the material of the first sub-active layer includes indium gallium zinc oxide. The ratio of the number of indium atoms, the number of gallium atoms, and the number of zinc atoms in the first sub-active layer is indium:gallium:zinc equal to M:1:N, where $0<M<1$ and $0<N<1$. For example, in one embodiment, the ratio of the number of indium atoms, the number of gallium atoms and the number of zinc atoms in the first sub-active layer is indium:gallium:zinc equal to 0.1:1:0.2, 0.4:1:0.2, 0.3:1:0.3, or 0.1:1:0.8.

The material of the third sub-active layer includes indium gallium zinc oxide. The ratio of the number of indium atoms, the number of gallium atoms, and the number of zinc atoms in the third sub-active layer is indium:gallium:zinc equal to X:1:Y, where $0<X<1$ and $0<Y<1$. For example, in one embodiment, the ratio of the number of indium atoms, the number of gallium atoms, and the number of zinc atoms in the first sub-active layer is indium:gallium:zinc equal to 0.3:1:0.2, 0.4:1:0.2, 0.3:1:0.3, or 0.6:1:0.8.

It should be noted that the atomic numbers of gallium in the first sub-active layer and the third sub-active layer may be the same or different.

The material of the second sub-active layer includes indium gallium zinc oxide, wherein the ratio of the number of indium atoms, the number of gallium atoms and the number of zinc atoms in the second sub-active layer is indium:gallium:zinc equal to 1:1:1.

In some embodiments, the first sub-active layer includes a nitrogen-doped indium gallium-zinc oxide active layer, and the third sub-active layer includes a nitrogen-doped indium gallium zinc oxide active layer. Due to the strong binding ability of nitrogen atoms and oxygen vacancies, the introduction of nitrogen elements can occupy the oxygen vacancies, effectively regulating the carrier concentration and defect concentration in the active layer. Thus, the mobility of the display panel is improved and the reliability of the driving substrate is improved.

In some embodiments, at least one of phosphorus, fluorine, selenium, or tellurium may also be doped into the first sub-active layer and/or the third sub-active layer.

In some embodiments, the driving substrate 10 may further include a fourth thin film transistor structure T4. The fourth thin film transistor structure T4 is disposed on the substrate 11 and corresponds to the display area AA. The fourth thin film transistor structure T4 includes a fourth active layer 15*a*, a fifth gate electrode 15*b*, a fourth source electrode 15*c*, and a fourth drain electrode 15*d*. The fourth active layer 15*a* and the third active layer 14*a* are provided in the same layer. The fifth gate electrode 15*b* and the fourth gate electrode 14*b* are provided in the same layer. The fourth source electrode 15*c*, the fourth drain electrode 15*d*, the third source electrode 14*c*, and the third drain electrode 14*d* are provided in the same layer.

It should be understood that the second thin film transistor structure T2 in the embodiments of the present application may be a driving thin film transistor, the third thin film transistor structure T3 may be a switching thin film transistor, and the fourth thin film transistor structure T4 may be a sensing thin film transistor.

In the embodiment of the present application, the structure of the driving circuit located in the display area AA is 3T1C (i.e., three thin film transistors and one capacitor). Under the 2T driving architecture, for a single sub-pixel, there is only one gate line to control the writing of the data voltage (Vdata). The written Vdata is passed to the gate electrode of the driving TFT and stored on the storage capacitor Cst. The source electrode of the driving TFT is in a floating state, and its initial potential is uncertain. Therefore, the display has serious flicker under the 2T driving architecture. Under the 3T driving structure, the writing of the source voltage of the driving TFT can be controlled by another gate line, that is, there are two gate lines, which greatly improves the display effect. Under the 3T driving architecture, accurate driving TFT mobility detection can be performed to further improve the display quality. Most of the current large-size OLED displays use a 3T driving architecture.

It should be understood that, in this embodiment of the present application, the gate insulating layer 17 may be a structure provided on the entire surface. The first gate electrode 12*b* may extend in-plane. It can be understood that the in-plane width of the first active layer 12*a* is smaller than the in-plane width of the first gate electrode 12*b*, and the in-plane width of the first light shielding layer LS1 is greater than the in-plane width of the first active layer 12*a*. Therefore, the first via hole h1 directly penetrates the gate insulating layer 17, so that the connection electrode 12*f* is not short-circuited with the first active layer 12*a*.

Figure 3:
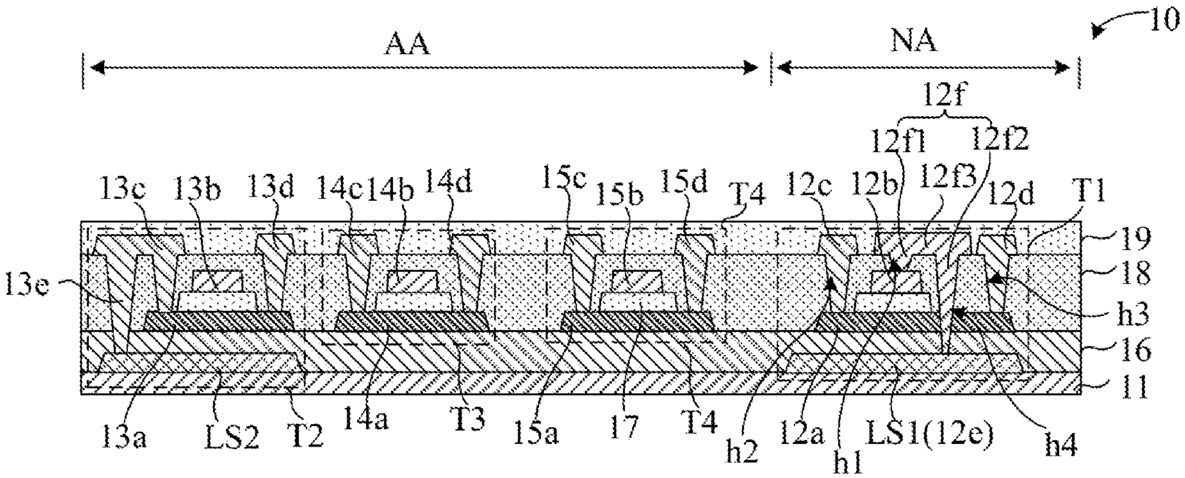
FIG. 3 is a schematic diagram of a second structure of a driving substrate provided by an embodiment of the present application.

Please refer to FIG. 3, which is a schematic diagram of a second structure of a driving substrate provided by an embodiment of the present application. The driving substrate 10 includes a display area AA and a non-display area NA, and the non-display area NA is located on at least one side of the display area AA. The non-display area NA includes the gate driving area GOA.

The driving substrate 10 includes a substrate 11, a first thin film transistor structure T1, and a second thin film transistor structure T2. The first thin film transistor structure T1 is disposed on the substrate 11 and corresponds to the non-display area NA. The first thin film transistor structure T1 includes a first light shielding layer LS1, a first active layer 12*a*, a first gate electrode 12*b*, a first source electrode 12*c* and a first drain electrode 12*d*. The first light shielding layer LS1 is multiplexed into the second gate electrode 12*e*. The first light shielding layer LS1 is electrically connected to the first gate electrode 12*b*. The second thin film transistor structure T2 is located on the substrate 11 and corresponds to the display area AA. The second thin film transistor structure T2 includes a second light shielding layer LS2, a second active layer 13*a*, a third gate electrode 13*b*, a second source electrode 13*c*, and a second drain electrode 13*d*. The second light shielding layer LS2 is electrically connected to the second source electrode 13*c*. In this embodiment of the present application, the first light shielding layer LS1 can not only be used to shield the first active layer 12*a* from light, but also prevent light from affecting the stability of the first active layer 12*a*. In addition, since the first light shielding layer LS1 is multiplexed into the second gate electrode 12*e*, and the first light shielding layer LS1 and the first gate electrode 12*b* are electrically connected, two conductive channels are formed. This increases the on-state current, thereby effectively suppressing the negative drift of the threshold voltage. The mobility of carriers is improved, thereby facilitating the design of narrow borders. In addition, the second light shielding layer LS2 can not only be used to shield the second active layer 13*a* from light, but also prevent the light from affecting the stability of the second active layer 13*a*. In addition, the second light shielding layer LS2 and the second source electrode 13*c* are electrically connected. Since the second light shielding layer LS2 has overlapping regions with the second active layer 13*a* and the third gate electrode 13*b*, parasitic capacitances are formed between the second light shielding layer LS2, the second active layer 12*a*, and the third gate electrode 13*b*, respectively. When the driving substrate is operating, the voltage on the second drain electrode 13*d* will change as the voltage applied to the data signal line is different. This causes the voltage on the second light shielding layer LS2 to change accordingly, thereby affecting the electrical properties of the second active layer 13*a*. By connecting the second light shielding layer LS2 and the second source electrode 13*c* to form an equipotential, it can be avoided that the voltage change on the second light shielding layer LS2 affects the electrical properties of the second active layer 13*a*.

Further, the first light shielding layer LS1 and the second light shielding layer LS2 are located on the substrate 11. The driving substrate 10 further includes a buffer layer 16, a gate insulating layer 17, a connection electrode 12*f*, an interlayer dielectric layer 18, and a passivation layer 19. The connection electrode 12*f* includes a first connection electrode 12*f*1, a second connection electrode 12*f*2, and a connection portion 12*f*3. The first connection electrode 12*f*1 and the second connection electrode 12*f*2 are connected by the connection part 12*f*3. The buffer layer 16 is located on the side of the first light shielding layer LS1 away from the substrate 11. The gate insulating layer 17 is located on the side of the first active layer 12*a* away from the buffer layer 16. The interlayer dielectric layer 18 is located on the side of the first gate electrode 12*b* away from the gate insulating layer 17. The connection part 12*f*3 is located on the interlayer dielectric layer 18. The interlayer dielectric layer 18 includes a first via hole h1, a second via hole h2, a third via hole h3, and a fourth via hole h4. The first via hole h1, the second via hole h2, and the third via hole h3 penetrate the interlayer dielectric layer 18. The fourth via hole h4 penetrates the interlayer dielectric layer 18 and the buffer layer 16. The first source electrode 12*c* and the first drain electrode 12*d* are electrically connected to the first active layer 12*a* through the second via hole h2 and the third via hole h3, respectively. The first connection electrode 12*f*1 is provided in the first via hole h1, and the second connection electrode 12*f*2 is provided in the fourth via hole h4. The passivation layer 19 is located on the side of the interlayer dielectric layer 18 away from the first gate electrode 12*b* and covers the first source electrode 12*c*, the first drain electrode 12*d*, and the connection electrode 12*f*.

The auxiliary electrode 13*e* is provided in the first contact hole cnt1. The second source electrode 13*c* and the second drain electrode 13*d* are electrically connected to the second active layer 13*a* through the second contact hole cnt2 and the third contact hole cnt3, respectively.

In the embodiment of the present application, the first light shielding layer LS1 and the first gate electrode 12*b* are electrically connected through the connection electrode 12*f*. Since the connection electrode 12*f* and the first source electrode 12*c* are disposed in the same layer, that is, the connection electrode 12*f* and the first source electrode 12*c* can be fabricated through the same mask process. Therefore, the driving substrate 10 of the embodiment of the present application further improves the carrier mobility of the non-display area NA without increasing the process cost, thereby realizing the design of a narrow frame.

It should be understood that, in the embodiment of the present application, the gate insulating layer 17 is formed by using the first gate electrode 12*b* as a self-alignment. The connection electrode 12*f* is provided in the same layer as the first source electrode 12*c*. The first via hole h1 directly penetrates the interlayer dielectric layer 18, and the fourth via hole h4 directly penetrates the interlayer dielectric layer 18 and the buffer layer 16. Thus, the connection electrode 12*f* is not short-circuited with the first active layer 12*a*.

Optionally, in some embodiments, the substrate 11 includes a first flexible layer, a first barrier layer, a second flexible layer, and a second barrier layer that are stacked in sequence. The first barrier layer is used to prevent water and oxygen from penetrating into the structure above the first barrier layer through one side of the first flexible layer. This prevents damage to the drive substrate 10. In some embodiments, the materials of the first barrier layer, the second barrier layer, and the buffer layer 16 include but are not limited to silicon-containing oxides, nitrides, or oxynitrides. For example, the material of the first barrier layer is at least one of SiOx, SiNx, or SiOxNy. The material of the first flexible layer may be the same as the material of the second flexible layer. It can include at least one of PI (polyimide), PET (polyethylene dicarboxylate), PEN (polyethylene naphthalate), PC (polycarbonate), PES (polyethersulfone), PAR (polyarylate-containing aromatic fluorotoluene), or PCO (polycyclic olefin). The buffer layer 16 may be a stacked silicon nitride layer and a silicon oxide layer. The silicon nitride layer is used to prevent water and oxygen from invading from one side of the second flexible layer, thereby causing damage to the film layer above the driving substrate 10. The silicon oxide layer is used to insulate the thin film transistors above.

The first active layer 12*a*, the second active layer 13*a*, the third active layer 14*a*, and the fourth active layer 15*a* are provided on the buffer layer 16 at intervals. The materials of the first active layer 12*a*, the second active layer 13*a*, the third active layer 14*a*, and the fourth active layer 15*a* may be one of indium gallium zinc oxide, indium zinc tin oxide or indium gallium zinc tin oxide or any combination thereof. Alternatively, the materials of the first active layer 12*a*, the second active layer 13*a*, the third active layer 14*a*, and the fourth active layer 15*a* may also be LTPO (low temperature polycrystalline oxide). The first light shielding layer LS1, the second light shielding layer LS2, the first gate electrode 12*b*, the third gate electrode 13*b*, the fourth gate electrode 14*b*, the fifth gate electrode 15*b*, the first source 12*c*, the first drain 12*d*, the second source electrode 13*c*, the second drain electrode 13*d*, the third source electrode 14*c*, the third drain electrode 14*d*, the fourth source electrode 15*c*, the fourth drain electrode 15*d*, the connection electrode 12*f*, and the auxiliary electrode 13*e* are made of materials such as one or any combination of metals such as silver (Ag), magnesium (Mg), aluminum (Al), tungsten (W), copper (Cu), nickel (Ni), chromium (Cr), molybdenum (Mo), titanium (Ti), platinum (Pt), tantalum (Ta), neodymium (Nd), or scandium (Sc), their alloys, their nitrides, and the like.

The materials of the gate insulating layer 17, the interlayer dielectric layer 18, and the passivation layer 19 include one of silicon oxide, silicon nitride, silicon oxynitride, or any combination thereof.

Figure 4:
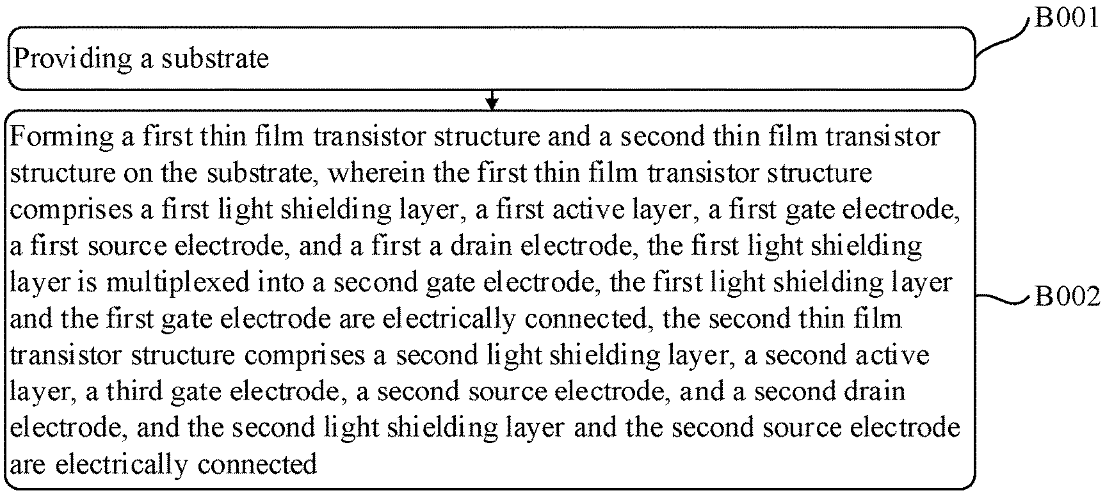
FIG. 4 is a flowchart of steps of a method of manufacturing a driving substrate provided by an embodiment of the present application.

Correspondingly, please refer to FIG. 4, which is a flowchart of a first step of the method for manufacturing a driving substrate provided by an embodiment of the present application. The manufacturing method of the driving substrate includes the following steps:

Step B001: providing a substrate 11.

Figure 5:
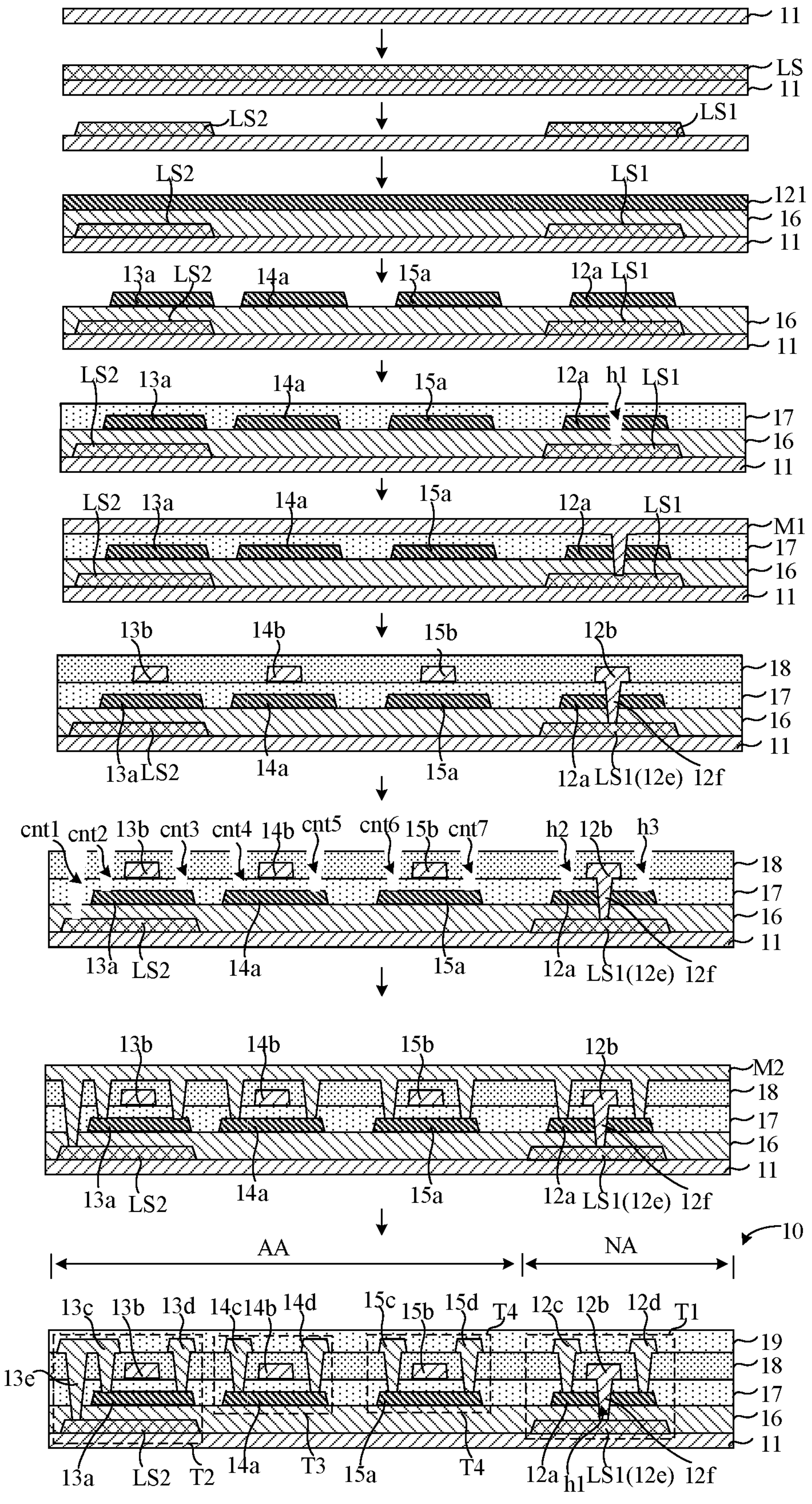
FIG. 5 is a first schematic diagram of a manufacturing method of a driving substrate provided by an embodiment of the present application.

Step B002: forming a first thin film transistor structure T1 and a second thin film transistor structure T2 on the substrate 11. The first thin film transistor structure T1 includes a first light shielding layer LS1, a first active layer 12*a*, a first gate electrode 12*b*, a first source electrode 12*c*, and a first drain electrode 12*d*. The first light shielding layer LS1 is multiplexed into the second gate electrode 12*e*. The first light shielding layer LS1 and the first gate electrode 12*b* are electrically connected. The second thin film transistor structure T2 includes a second light shielding layer LS2, a second active layer 13*a*, a third gate electrode 13*b*, a second source electrode 13*c*, and a second drain electrode 13*d*. The second light shielding layer LS2 is electrically connected to the second source electrode 13*c*, as illustrated in FIG. 5.

Further, step B002 further includes forming a third thin film transistor structure T3 and a fourth thin film transistor structure T4. The third thin film transistor structure T3 includes a third active layer 14*a*, a fourth gate electrode 14*b*, a third source electrode 14*c*, and a third drain electrode 14*d*. The fourth thin film transistor structure T4 includes a fourth active layer 15*a*, a fifth gate electrode 15*b*, a fourth source electrode 15*c*, and a fourth drain electrode 15*d*.

Step B002 may specifically include: first, forming a light shielding material layer LS on the substrate 11, and patterning the light shielding material layer LS to form a first light shielding layer LS1 and a second light shielding layer LS2.

Next, the buffer layer 16 is formed on the first light shielding layer LS1 and the second light shielding layer LS2.

Next, a semiconductor material layer 121 is formed on the buffer layer 16, and the semiconductor material layer 121 is patterned to form a first active layer 12*a*, a second active layer 13*a*, a third active layer 14*a*, and a fourth active layer Then, a gate insulating layer 17 is formed on the buffer layer 16, and the gate insulating layer 17 is processed by a yellow light process to form the first via hole h1.

Subsequently, a first metal layer M1 is formed on the gate insulating layer 17, and the first metal layer M1 is patterned to form a first gate electrode 12*b*, a third gate electrode 13*b*, a fourth gate electrode 14*b*, a fifth gate electrode 15*b*, a connection electrode 12*f*, and an auxiliary electrode 13*e*. The connection electrode 12*f* is provided in the first via hole h1, and the first gate electrode 12*b* and the first light shielding layer LS1 are electrically connected through the connection electrode 12*f*.

Next, an interlayer dielectric layer 18 is formed on the first gate electrode 12*b*, and the interlayer dielectric layer 18 is processed by a yellow light process to form a second via hole h2, a third via hole h3, a first contact hole cnt1, a second contact hole cnt2, a third contact hole cnt3, a fourth contact hole cnt4, a fifth contact hole cnt5, a sixth contact hole cnt6, and a seventh contact hole cnt7.

Next, a second metal layer M2 is formed on the interlayer dielectric layer 18, and the second metal layer M2 is patterned to form a first source electrode 12*c*, a first drain electrode 12*d*, a second source electrode 13*c*, a second drain electrode 13*d*, a third source electrode 14*c*, a third drain electrode 14*d*, a fourth source electrode 15*c*, a fourth drain electrode 15*d*, and an auxiliary electrode 13*e*. The first source electrode 12*c* and the first drain electrode 12*d* are electrically connected to the first active layer 12*a* through the second via hole h2 and the third via hole h3, respectively. The auxiliary electrode 13*e* is provided in the first contact hole cnt1. The second source electrode 13*c* and the second drain electrode 13*d* are electrically connected to the second active layer 13*a* through the second contact hole cnt2 and the third contact hole cnt3, respectively. The third source electrode 14*c* and the third drain electrode 14*d* are electrically connected to the third active layer 14*a* through the fourth contact hole cnt4 and the fifth contact hole cnt5, respectively. The fourth source electrode 15*c* and the fourth drain electrode 15*d* are electrically connected to the fourth active layer 15*a* through the sixth contact hole cnt6 and the seventh contact hole cnt7, respectively.

Finally, the passivation layer 19 is formed on the interlayer dielectric layer 18, thereby forming the driving substrate 10.

In the manufacturing method of the driving substrate provided by the embodiment of the present application, the gate insulating layer 17 may be a structure provided on the entire surface, and the first gate 12*b* may extend inward. It can be understood that the in-plane width of the first active layer 12*a* is smaller than the in-plane width of the first gate electrode 12*b*, and the in-plane width of the first light shielding layer LS1 is greater than the in-plane width of the first active layer 12*a*. width. Therefore, the first via hole h1 directly penetrates the gate insulating layer 17. Thus, the connection electrode 12*f* is not short-circuited with the first active layer 12*a*. In this embodiment of the present application, the first light shielding layer LS1 can not only be used to shield the first active layer 12*a* from light, but also prevent light from affecting the stability of the first active layer 12*a*. In addition, since the first light shielding layer LS1 is multiplexed into the second gate electrode 12*e*, and the first light shielding layer LS1 and the first gate electrode 12*b* are electrically connected, two conductive channels are formed. This increases the on-state current, thereby effectively suppressing the negative drift of the threshold voltage. The mobility of carriers is improved, thereby facilitating the design of narrow borders. In addition, the second light shielding layer LS2 can not only be used to shield the second active layer 13*a* from light, but also prevent the light from affecting the stability of the second active layer 13*a*. In addition, the second light shielding layer LS2 and the second source electrode 13*c* are electrically connected. Since the second light shielding layer LS2 has overlapping regions with the second active layer 13*a* and the third gate electrode 13*b*, parasitic capacitances are formed between the second light shielding layer LS2 and the second active layer 12*a* and the third gate electrode 13*b*, respectively. When the driving substrate is operating, the voltage on the second drain electrode 13*d* will change as the voltage applied to the data signal line is different. This causes the voltage on the second light shielding layer LS2 to change accordingly, thereby affecting the electrical properties of the second active layer 13*a*. By connecting the second light shielding layer LS2 and the second source electrode 13*c* to form an equipotential, it can be avoided that the voltage change on the second light shielding layer LS2 affects the electrical properties of the second active layer 13*a*.

Figure 6:
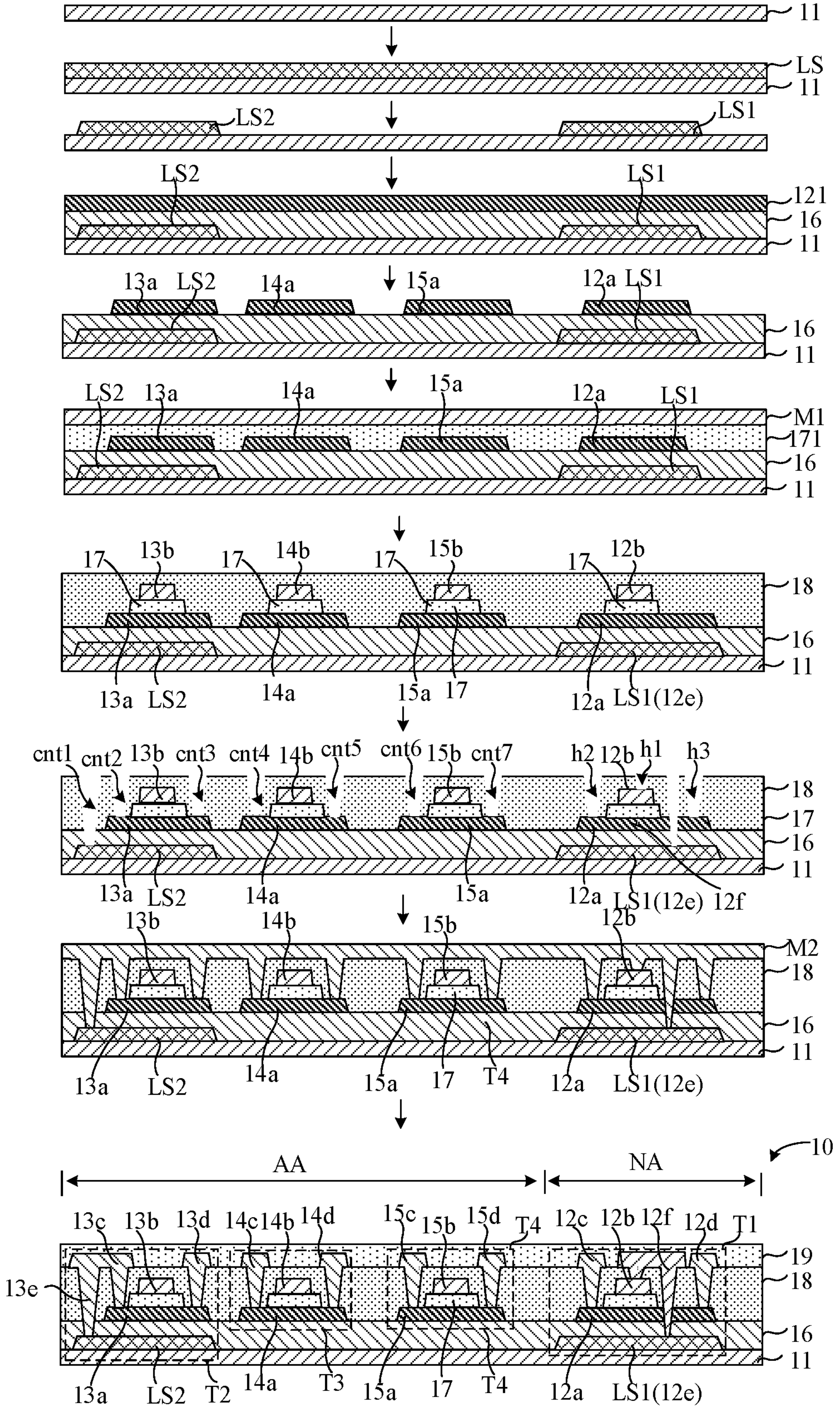
FIG. 6 is a second schematic diagram of a manufacturing method of a driving substrate provided by an embodiment of the present application.

In some embodiments, referring to FIG. 6, step B002 may specifically include:

First, a light shielding material layer LS is formed on the substrate 11, and the light shielding material layer LS is patterned to form a first light shielding layer LS1 and a second light shielding layer LS2.

Next, the buffer layer 16 is formed on the first light shielding layer LS1 and the second light shielding layer LS2.

Next, a semiconductor material layer 121 is formed on the buffer layer 16, and the semiconductor material layer 121 is patterned to form a first active layer 12*a*, a second active layer 13*a*, a third active layer 14*a*, and a fourth active layer 15*a*.

Then, an insulating material layer 171 is formed on the first active layer 12*a*, the second active layer 13*a*, the third active layer 14*a*, and the fourth active layer 15*a*.

Subsequently, a first metal layer M1 is formed on the gate insulating layer 17, and the first metal layer M1 is patterned to form a first gate electrode 12*b*, a third gate electrode 13*b*, a fourth gate electrode 14*b*, and a fifth gate electrode 15*b*.

Next, using the first gate electrode 12*b*, the third gate electrode 13*b*, the fourth gate electrode 14*b*, and the fifth gate electrode 15*b* for self-alignment, the insulating material layer 171 is patterned to form the gate insulating layer 17.

Next, an interlayer dielectric layer 18 is formed on the first gate electrode 12*a*, and the interlayer dielectric layer 18 is processed by a yellow light process to form a first via hole h1, a second via hole h2, a third via hole h3, a first contact hole cnt1, a second contact hole cnt2, a third contact hole cnt3, a fourth contact hole cnt4, a fifth contact hole cnt5, a sixth contact hole cnt6, and a seventh contact hole cnt7.

Next, a second metal layer M2 is formed on the interlayer dielectric layer 18, and the second metal layer M2 is patterned to form a first source electrode 12*c*, a first drain electrode 12*d*, a second source electrode 13*c*, and a second drain electrode 13*d*, a third source electrode 14*c*, a third drain electrode 14*d*, a fourth source electrode 15*c*, a fourth drain electrode 15*d*, a connection electrode 12*f*, and an auxiliary electrode 13*e*. The connection electrode 12*f* includes a first connection electrode 12*f*1, a second connection electrode 12*f*2, and a connection part 12*f*3. The first connection electrode 12*f*1 and the second connection electrode 12*f*2 are connected by the connection part 12*f*3. The first connection electrode 12*f*1 is provided in the first via hole h1. The second connection electrode 12*f*2 is provided in the fourth via hole h4. The first source electrode 12*c* and the first drain electrode 12*d* are electrically connected to the first active layer 12*a* through the second via hole h2 and the third via hole h3, respectively. The auxiliary electrode 13*e* is provided in the first contact hole cnt1. The second source electrode 13*c* and the second drain electrode 13*d* are electrically connected to the second active layer 13*a* through the second contact hole cnt2 and the third contact hole cnt3, respectively. The third source electrode 14*c* and the third drain electrode 14*d* are electrically connected to the third active layer 14*a* through the fourth contact hole cnt4 and the fifth contact hole cnt5, respectively. The fourth source electrode 15*c* and the fourth drain electrode 15*d* are electrically connected to the fourth active layer 15*a* through the sixth contact hole cnt6 and the seventh contact hole cnt7, respectively.

Finally, a passivation layer 19 is formed on the interlayer dielectric layer 18 to form the driving substrate 10.

In the manufacturing method of the driving substrate provided by the embodiment of the present application, the first light shielding layer LS1 and the first gate electrode 12*b* are electrically connected through the connection electrode 12*f*. Since the connection electrode 12*f* and the first source electrode 12*c* are disposed in the same layer, that is, the connection electrode 12*f* and the first source electrode 12*c* can be fabricated through the same mask process. Therefore, the driving substrate 10 of the embodiment of the present application further improves the carrier mobility of the non-display area NA without increasing the process cost, thereby realizing the design of a narrow frame.

Figure 7:
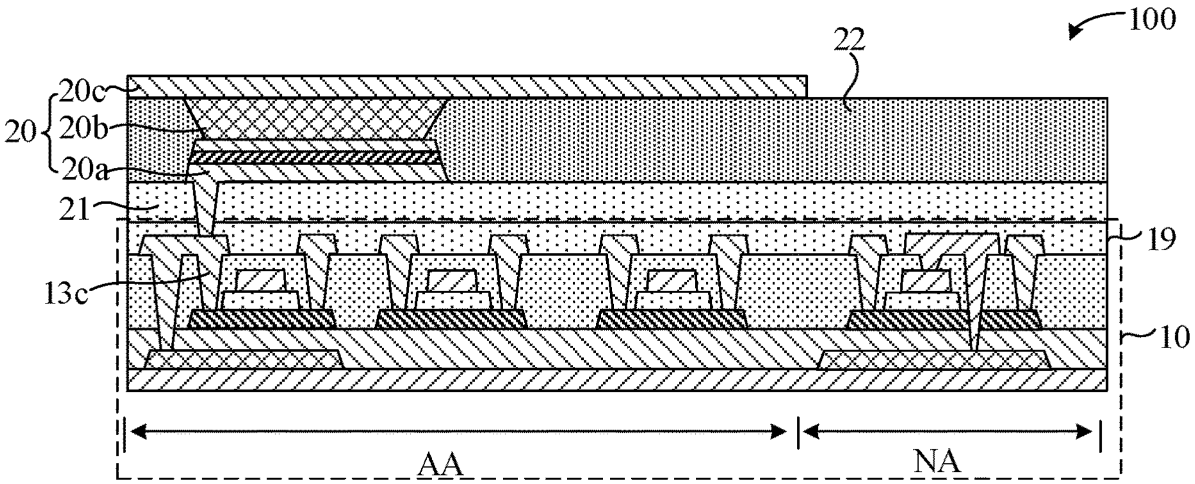
FIG. 7 is a schematic structural diagram of a display panel according to an embodiment of the present application.

Correspondingly, referring to FIG. 7, an embodiment of the present application further provides a display panel. The display panel 100 includes the driving substrate 10 and the light-emitting functional layer 20 described in any of the foregoing embodiments. The light-emitting functional layer 20 is disposed on the driving substrate 10 and corresponds to the display area AA.

Specifically, the light-emitting functional layer 20 includes an anode 20*a*, a light-emitting layer 20*b*, and a cathode 20*c*. The display panel 100 further includes a planarization layer 21 and a pixel definition layer 22. The planarization layer 21 is provided on the passivation layer 19. The anode electrode 20*a* is electrically connected to the second source electrode 13*c* through a via hole. The material of the anode 20*a* may include indium tin oxide, silver and indium tin oxide which are stacked in this order. The pixel definition layer 22 has an opening, and the light-emitting layer 20*b* is defined in the opening of the pixel definition layer 22. The cathode 20*c* covers the light-emitting layer 20*b* and a part of the pixel definition layer 22.

To sum up, although the present application has disclosed the above-mentioned preferred embodiments, the above-mentioned preferred embodiments are not intended to limit the present application. Those skilled in the art can make various changes and modifications without departing from the spirit and scope of the present application. Therefore, the protection scope of the present application is subject to the scope defined by the claims.

What is claimed is:

1. A manufacturing method of a driving substrate, wherein the manufacturing method of the driving substrate comprises the following steps:

providing a substrate;

forming a first thin film transistor structure and a second thin film transistor structure on the substrate, wherein the first thin film transistor structure comprises a first light shielding layer, a first active layer, a first gate electrode, a first source electrode, and a first drain electrode, the first light shielding layer is multiplexed into a second gate electrode, the first light shielding layer and the first gate electrode are electrically connected, the second thin film transistor structure comprises a second light shielding layer, a second active layer, a third gate electrode, a second source electrode, and a second drain electrode, and the second light shielding layer and the second source electrode are electrically connected;

wherein the step of forming the first thin film transistor structure and the second thin film transistor structure on the substrate further comprises:

forming a light shielding material layer on the substrate, and patterning the light shielding material layer to form the first light shielding layer and the second light shielding layer;

forming a buffer layer on the first light shielding layer and the second light shielding layer;

forming a semiconductor material layer on the buffer layer, and patterning the semiconductor material layer to form the first active layer and the second active layer;

forming a gate insulating layer on the buffer layer, and processing the gate insulating layer by a yellow light process to form a first via hole;

forming a first metal layer on the gate insulating layer, and patterning the first metal layer to form the first gate electrode, the third gate electrode, and a connection electrode, wherein the connection electrode is disposed in the first via hole, and the first gate electrode and the first light shielding layer are electrically connected through the connection electrode;

forming an interlayer dielectric layer on the first gate electrode, and processing the interlayer dielectric layer by a yellow light process to form a second via hole, a third via hole, a first contact hole, a second contact hole, and a third contact hole;

forming a second metal layer on the interlayer dielectric layer, and patterning the second metal layer to form the first source electrode, the first drain electrode, the second source electrode, the second drain electrode, and an auxiliary electrode, wherein the first source electrode and the first drain electrode are electrically connected to the first active layer through the second via hole and the third via hole, respectively, the auxiliary electrode is disposed in the first contact hole, and the second source electrode and the second drain electrode are electrically connected to the second active layer through the second contact hole and the third contact hole, respectively;

forming a passivation layer on the interlayer dielectric layer.

2. A manufacturing method of a driving substrate, wherein the manufacturing method of the driving substrate comprises the following steps:

providing a substrate;

forming a first thin film transistor structure and a second thin film transistor structure on the substrate, wherein the first thin film transistor structure comprises a first light shielding layer, a first active layer, a first gate electrode, a first source electrode, and a first drain electrode, the first light shielding layer is multiplexed into a second gate electrode, the first light shielding layer and the first gate electrode are electrically connected, the second thin film transistor structure comprises a second light shielding layer, a second active layer, a third gate electrode, a second source electrode, and a second drain electrode, and the second light shielding layer and the second source electrode are electrically connected;

wherein the step of forming the first thin film transistor structure and the second thin film transistor structure on the substrate further comprises:

forming a light shielding material layer on the substrate, and patterning the light shielding material layer to form the first light shielding layer and the second light shielding layer;

forming a buffer layer on the first light shielding layer and the second light shielding layer;

forming a semiconductor material layer on the buffer layer, and patterning the semiconductor material layer to form the first active layer and the second active layer;

forming an insulating material layer on the first active layer and the second active layer;

forming a first metal layer on the insulating material layer, and patterning the first metal layer to form the first gate electrode and the third gate electrode;

using the first gate electrode and the third gate electrode to be self-aligned, and patterning the insulating material layer to form a gate insulating layer;

forming an interlayer dielectric layer on the first gate electrode, and processing the interlayer dielectric layer by a yellow light process to form a first via hole, a second via hole, a third via hole, a fourth via hole, a first contact hole, a second contact hole, and a third contact hole;

forming a second metal layer on the interlayer dielectric layer, and patterning the second metal layer to form the first source electrode, the first drain electrode, the connection electrode, the second source electrode, the second drain electrode, and an auxiliary electrode, wherein the connection electrode comprises a first connection electrode, a second connection electrode, and a connection part, and the first connection electrode and the second connection electrode are connected by the connection part, the first connection electrode is disposed in the first via hole, the second connection electrode is disposed in the fourth via hole, the first source electrode and the first drain electrode are electrically connected through the second via hole and the third via hole, respectively; the auxiliary electrode is disposed in the first contact hole, and the second source electrode and the second drain electrode are electrically connected to the second active layer through the second contact hole and the third contact hole, respectively;

forming a passivation layer on the interlayer dielectric layer.

* * * * *